(12) United States Patent
Ogawa

(10) Patent No.: US 12,256,509 B2
(45) Date of Patent: Mar. 18, 2025

(54) DOCUMENT COVER CLOSER AND OFFICE EQUIPMENT HAVING THE SAME

(71) Applicant: KEM HONGKONG LIMITED, Kowloon (HK)

(72) Inventor: Satoshi Ogawa, Kanagawa (JP)

(73) Assignee: KEM HONGKONG LIMITED, Tsimshatsui (HK)

( * ) Notice: Subject to any disclaimer, the term of this patent is extended or adjusted under 35 U.S.C. 154(b) by 114 days.

(21) Appl. No.: 17/898,643

(22) Filed: Aug. 30, 2022

(65) Prior Publication Data

US 2023/0064679 A1 Mar. 2, 2023

(51) Int. Cl.
*H05K 5/00* (2006.01)
*H05K 5/02* (2006.01)

(52) U.S. Cl.
CPC ................... *H05K 5/0226* (2013.01)

(58) Field of Classification Search
CPC . H05K 5/0226; H04N 1/00554; E05F 1/1261; E05F 1/1215; E05F 1/1276; E05D 11/1064; E05D 3/022; G03G 15/605
USPC ............................ 312/299, 328, 327; 16/239
See application file for complete search history.

(56) References Cited

U.S. PATENT DOCUMENTS

| | | | | |
|---|---|---|---|---|
| 3,128,007 A | * | 4/1964 | Kops | F24F 13/00 312/236 |
| 5,359,812 A | * | 11/1994 | Mayfield | E06B 7/367 49/383 |
| 6,298,605 B1 | * | 10/2001 | Delefosse | E06B 7/367 49/383 |
| 7,455,016 B2 | * | 11/2008 | Perin | B60N 2/79 312/307 |
| 2008/0237252 A1 | * | 10/2008 | Elefante | E05D 3/022 220/811 |
| 2023/0079992 A1 | * | 3/2023 | Ogawa | F16C 11/04 312/319.2 |

FOREIGN PATENT DOCUMENTS

| | | | | | |
|---|---|---|---|---|---|
| CN | 111381473 A | * | 7/2020 | ........... | G03G 15/605 |
| JP | H11-95339 A | | 4/1999 | | |
| JP | 2020106742 A | * | 7/2020 | ........... | G03G 15/605 |
| WO | WO-2019117163 A1 | * | 6/2019 | ......... | E05D 11/0054 |

OTHER PUBLICATIONS

English abstract of JP2020106742 (Year: 2020).*

* cited by examiner

*Primary Examiner* — Janet M Wilkens
(74) *Attorney, Agent, or Firm* — NOTARO, MICHALOS & ZACCARIA P.C.

(57) ABSTRACT

A document cover closer for preventing an accident of pinching finger(s), as well as office equipment using the same, comprising: an attaching part attached to the main body side of office equipment having a document cover; a supporting part rotatably and pivotally supported on the attaching part via a first hinge shaft; and a lift part attached to the document cover, wherein it overlaps the supporting part and is pivotally supported on the supporting part via a second hinge shaft to be rotatable in a direction contrary to that of the supporting part. A finger pinching preventing cover, wherein an upper end portion of the finger pinching preventing cover is rotatably coupled to the lift part, while its lower end portion is slidably engaged with rail portions provided on both side portions of the attaching part, is also provided.

2 Claims, 11 Drawing Sheets

DOCUMENT COVER CLOSER AND OFFICE EQUIPMENT HAVING THE SAME

FIELD OF THE INVENTION

The invention relates to a document cover closer arranged in office equipment such as copying machine, multifunction printer, printer, facsimile and scanner, as well as to office equipment having the document cover closer.

BACKGROUND ART

In some cases, a document cover is rotatably attached via a document cover closer to an upper surface on a rear portion of a main body of office equipment such as copying machine, printer, facsimile and scanner. This document cover closer is a kind of hinge mechanism which can rotatably and pivotally support the document cover about a hinge shaft to bring the document cover into a close contact with a contact glass surface on the upper surface of the main body, as well as expose the contact glass. To set a document on the contact glass surface, the document cover is rotated (vertically opened and closed) to expose (open) the contact glass, and the document is placed on the surface of the contact glass, and then the document cover is closed to bring the document into a pressurized contact with the contact glass surface.

Among such document cover closers, the one provided with a lift member and compression coil springs is known wherein the document cover closer can bring the document into a close contact with the contact glass regardless of the thickness of the document, as well as rotate the document cover without giving a feel of its original weight by an urging force of the compression coil springs (see for example JP Laid-Open Patent Application No. H11-95339).

The document cover closer disclosed in JP Laid-Open Patent Application No. H11-95339 comprises an attaching member attached to the main body side of office equipment; a supporting member rotatably and pivotally supported on the attaching member via a first hinge shaft; a lift member overlapping the supporting member as well as rotatably and pivotally supported on the supporting member via a second hinge shaft; and compression coil springs provided between the lift member and the attaching member to urge the lift member in a direction in which the lift member overlaps the supporting member.

In this manner, a document cover closer is configured to ensure that, when a document cover is rotated in a closing direction after a placement of a thick document on a contact glass, a document cover comes into contact with an end of the document on a document cover closer side, that a lift member is reversed relative to a supporting member about a second hinge shaft to bring the thick document into a pressurized contact with a contact glass, and that it can prevent an external light from entering into the interior of office equipment.

In doing so, a space portion comes up between a rear portion of a lift member and a rear portion of a supporting member, as shown in FIG. 10. A document cover closer is configured to ensure that the lift member returns to an original position at which it overlaps the supporting member, when the document cover closer is once opened in an opening direction with a thick document being removed from a contact glass; when the document cover is to be closed with the lift member being reversed, the document cover is closed with the document cover, the lift member not returning to the original position, and it is closed with its tip side being lowered and the space portion coming up between the rear portion of the lift member and the rear portion of the supporting member. Even in this case, once the document cover is opened in the opening direction, it can return to the original position at which the lift member overlaps the supporting member; but in some cases the operator skips this operation due to his lack of knowledge or misunderstanding about the device to push the document cover down, by bringing his hands toward the rear end portion of the document cover and putting them on the area of the lift member. In this manner, there is a problem that he may catch his finger(s) in the space portion coming up between the lift member and the supporting member to injure his finger(s).

SUMMARY OF THE INVENTION

The present invention is intended to solve a problem with a conventional art as described above, and has an object to provide a document cover closer capable of preventing an accident of pinching finger(s) as described above in a conventional document cover closer as described above, as well as office equipment using such a document cover closer.

To meet an object as mentioned above, a document cover closer according to this application comprises an attaching member attached to the main body side of office equipment having a document cover; a supporting member rotatably and pivotally supported on the attaching member via a first hinge shaft; and a lift member attached to the document cover, wherein it overlaps the supporting member and is pivotally supported on the supporting member via a second hinge shaft to be rotatable in a direction contrary to that of the supporting member, and is characterized in that a finger pinching preventing cover is provided, wherein an upper end portion of the finger pinching preventing cover is rotatably coupled to the lift member, while its lower end portion is slidably engaged with rail portions provided on both side portions of the attaching member in order to block up a space portion formed between the lift member and the supporting member.

Here, a document cover closer according to this application is characterized in that the finger pinching preventing cover is attached at an upper end portion side of its both side plates to a rear end portion side of a lift member via pivotally supporting pins.

Still further, a document cover closer according to this application is characterized in that the finger pinching preventing cover comprises on its lower end portion side engaging projections slidably engaged with rail portions provided on both sides of a rear end portion of an attaching member.

Still further, a document cover closer according to this application is characterized in that the finger pinching preventing cover is attached at an upper end portion side of its both side plates to a rear end portion side of a lift member via pivotally supporting pins, and it comprises on its lower end portion side engaging projections slidably engaged with rail portions provided on both sides of a rear end portion of an attaching member.

Still further, a document cover closer according to this application is characterized in that rail portions, wherein a finger pinching preventing cover is provided on an attaching member, are formed by extending both side plates from both ends of a rear plate of the attaching member toward a rear end portion side, and by folding its tip portion side inward.

Since the invention is constructed as described in the foregoing, it can provide a very safe document cover closer structured at a low cost which can bring even a thick document such as a book into a pressurized contact with a contact glass by horizontally covering it with a document cover, prevent as much as possible the external light from entering into the interior of a main body, and prevent an accident of pinching fingers in space portions coming up on respective rear portions of a lift member and a supporting member, with achieving such operation and effect.

EMBODIMENT

In the following, reference is made to a document cover closer according to the invention, as well as to office equipment using the document cover closer, based on the attached drawings.

FIG. 1 to FIG. 11 show a perspective view illustrating an example of a document cover closer of an embodiment according to the invention and office equipment using the document cover closer; In some cases, the document cover closers 1A, 1B of the invention belong to a category of hinge device which rotatably attaches a document cover 3 to an upper surface of a main body 2B of office equipment such as copying machine, multifunction printer, printer, facsimile and scanner.

Figure 1:
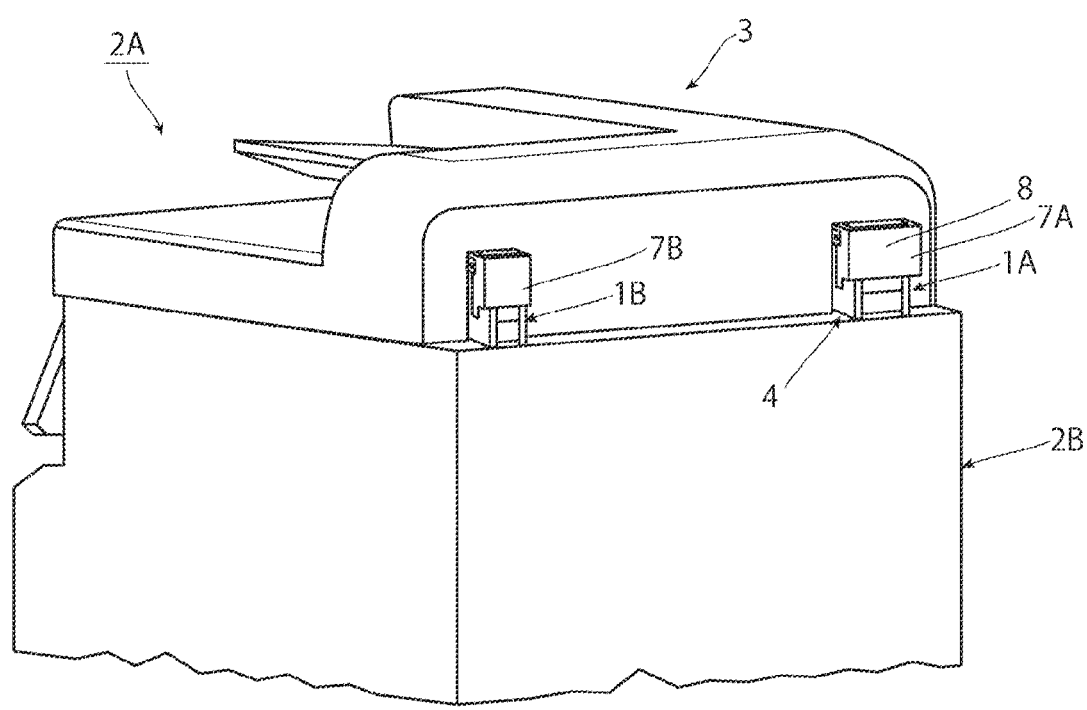
FIG. 1 shows a perspective view illustrating office equipment, typically a copying machine equipped with a document cover closer according to the invention as seen from the rear side.
Figure 2:
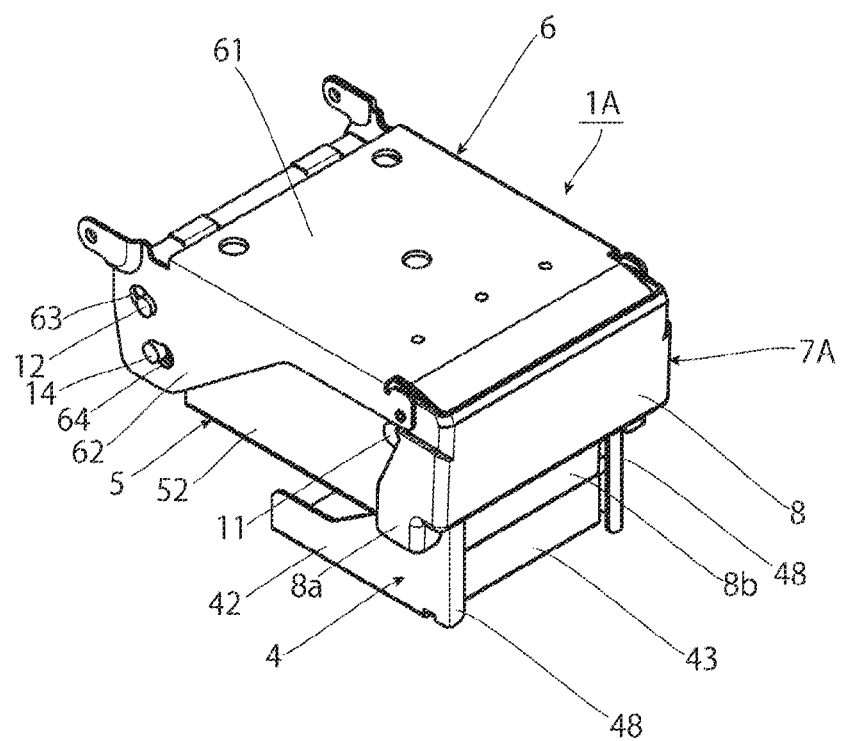
FIG. 2 shows a perspective view illustrating a document cover closer according to the invention as seen obliquely from the rear side.
Figure 3:
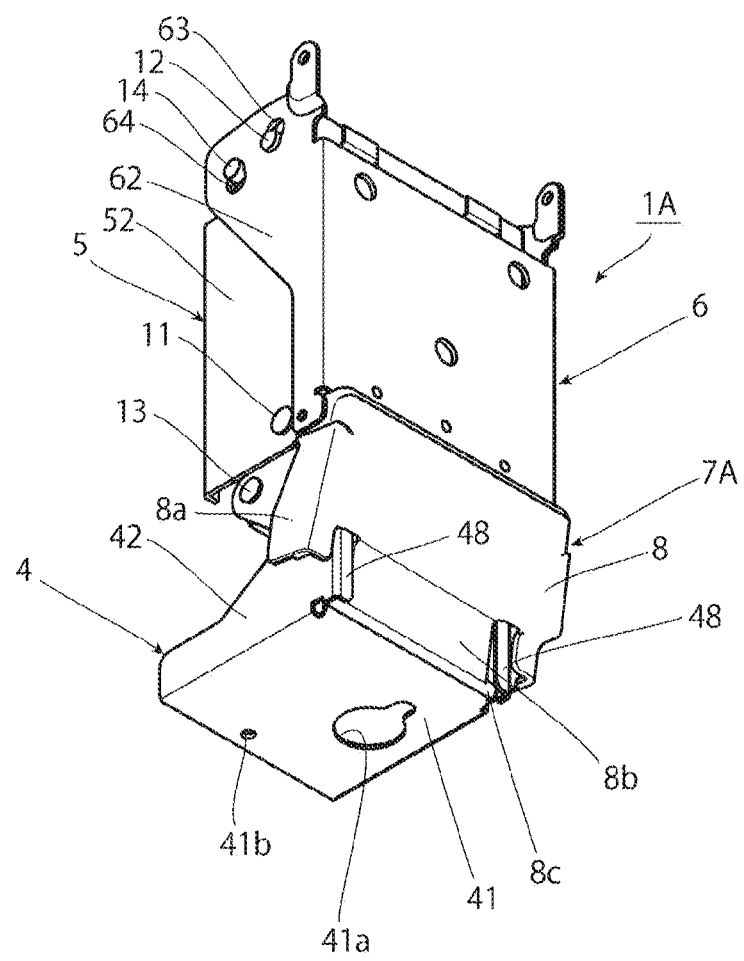
FIG. 3 shows a perspective view illustrating an attaching member of a document cover closer according to the invention as is opened 90 degrees relative to a supporting member as seen obliquely from the rear side.
Figure 4:
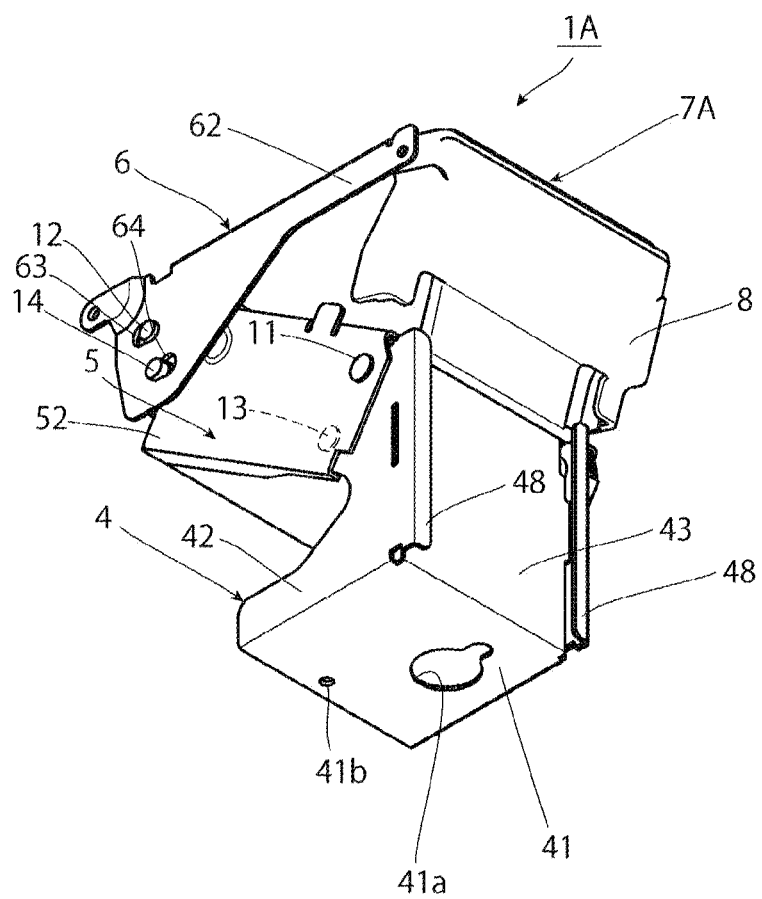
FIG. 4 shows a perspective view illustrating a lift member of a document cover closer according to the invention as reversed relative to a supporting member as seen obliquely from the rear side.

As shown in FIG. 1, document cover closers consist of a larger one 1A on the right side and a smaller one 1B on the left side of FIG. 1, wherein the document cover closer 1A on the right side uses double coil springs and an oil damper, while the document cover closer 1B on the left side—only a single coil spring. This is because an automatic document feeder is provided on one side portion of a document cover 3, so that more load is applied only to the document cover closer on the right side. As shown in FIG. 1, finger pinching preventing covers 7A, 7B according to the invention are attached to both, so these have an identical structure though their sizes are different. In the following, a larger document cover closer 1A is described further in detail. However, document cover closers on the right and the left may also have the same size and the same structure, though both are shown in different sizes in embodiment.

A document cover closer 1A according to the invention comprises an attaching member 4 attached to a main body 2B of a copying machine 2A; a supporting member 5 rotatably coupled via a first hinge shaft 11 to both side plates 42, 42 of the attaching member 4; a lift member 6 for attaching a document cover 3, wherein it is rotatably coupled via a second hinge shaft 12 to the both side plates 52, 52 of the supporting member 5. It is further configured to ensure that the supporting member 5 is rotated during an ordinary use from a closed position at which the document cover 3 is in contact with an upper surface of the main body 2B to the maximum opened position at use, and that the supporting member 5 is rotated during its maintenance from the maximum opened position at use to the maximum opened position. The document cover closer 1A according to the invention is characterized in that a finger pinching preventing cover 7A for preventing finger(s) from entering into a space portion R formed when the lift member 6 is rotated about the second hinge shaft 12 passing through the supporting member 5 is provided on the document cover closer 1A. It is noted that the first hinge shaft 11 and the second hinge shaft 12 are shown in the drawings as being respectively single pieces, but it is also acceptable that each of these is divided into two and each of both side plates 42, 42 of the attaching member 4 is separately pivotally attached to matching one of the both side plates 52, 52 of the supporting member 5, and also each of the both side plates 52, 52 of the supporting member 5 to one of both side plates 62, 62 of a lift member 6. The first hinge shaft 11 and the second hinge shaft 12 in the present invention include the latter. It is noted that reference numerals 11a, 11a denote bearing members, and 11b, 11b—washers.

Figure 7A:
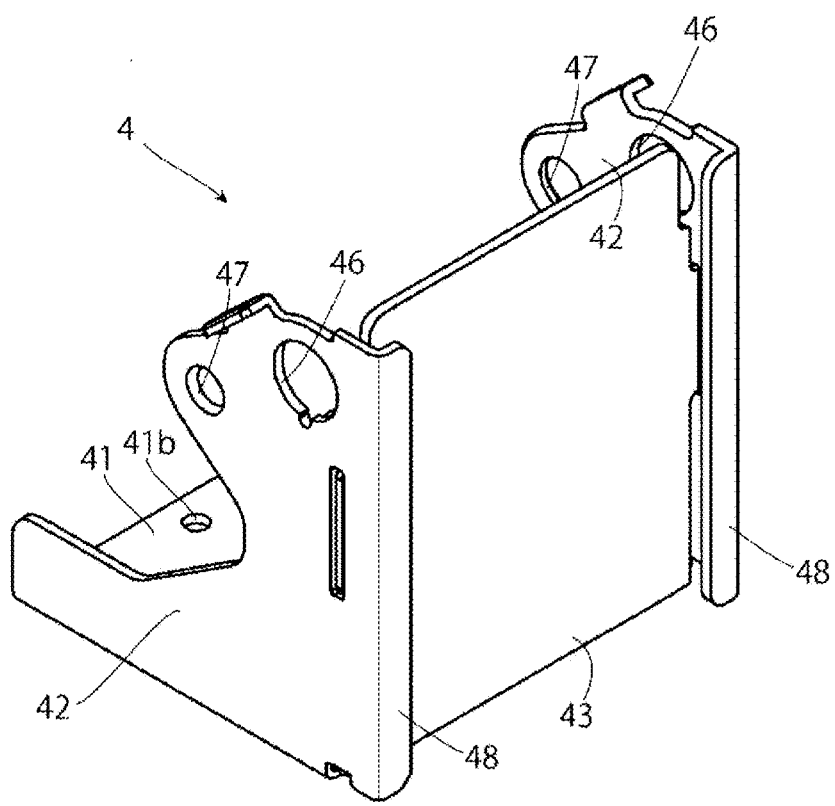
FIGS. 7A and 7B show an attaching member of a document cover closer according to the invention, FIG. 7A being a perspective view as seen from the rear side, and FIG. 7B—a side cross section.
Figure 7B:
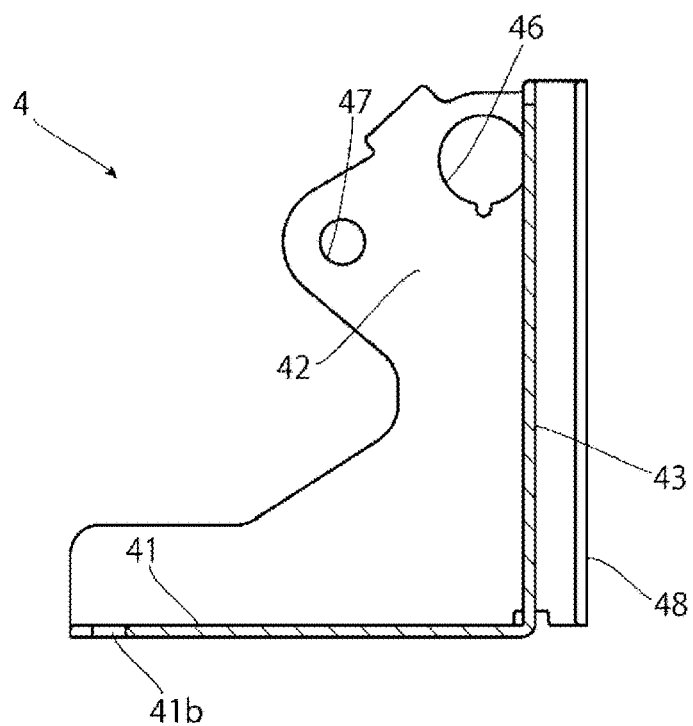
Figure 8:
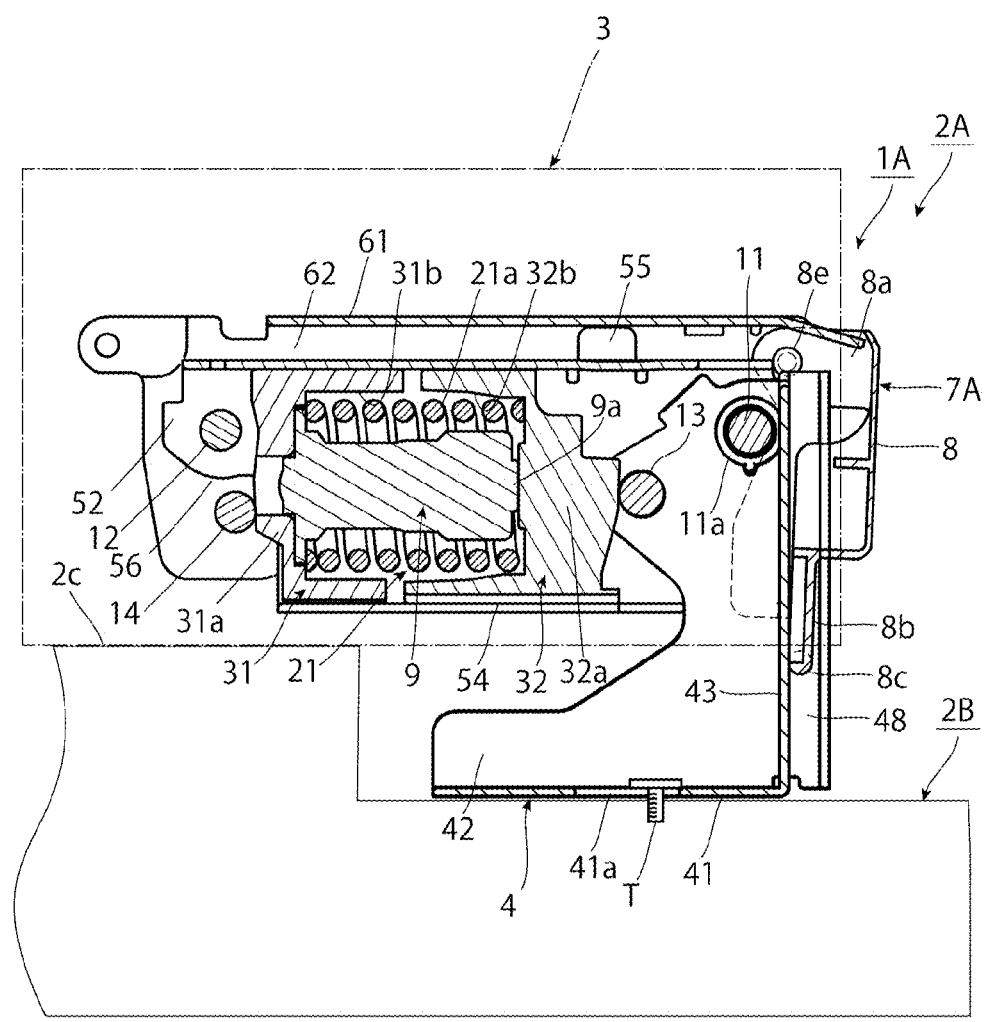
FIG. 8 shows a vertical cross section of a document cover closer according to the invention in a closed state.
Figure 9:
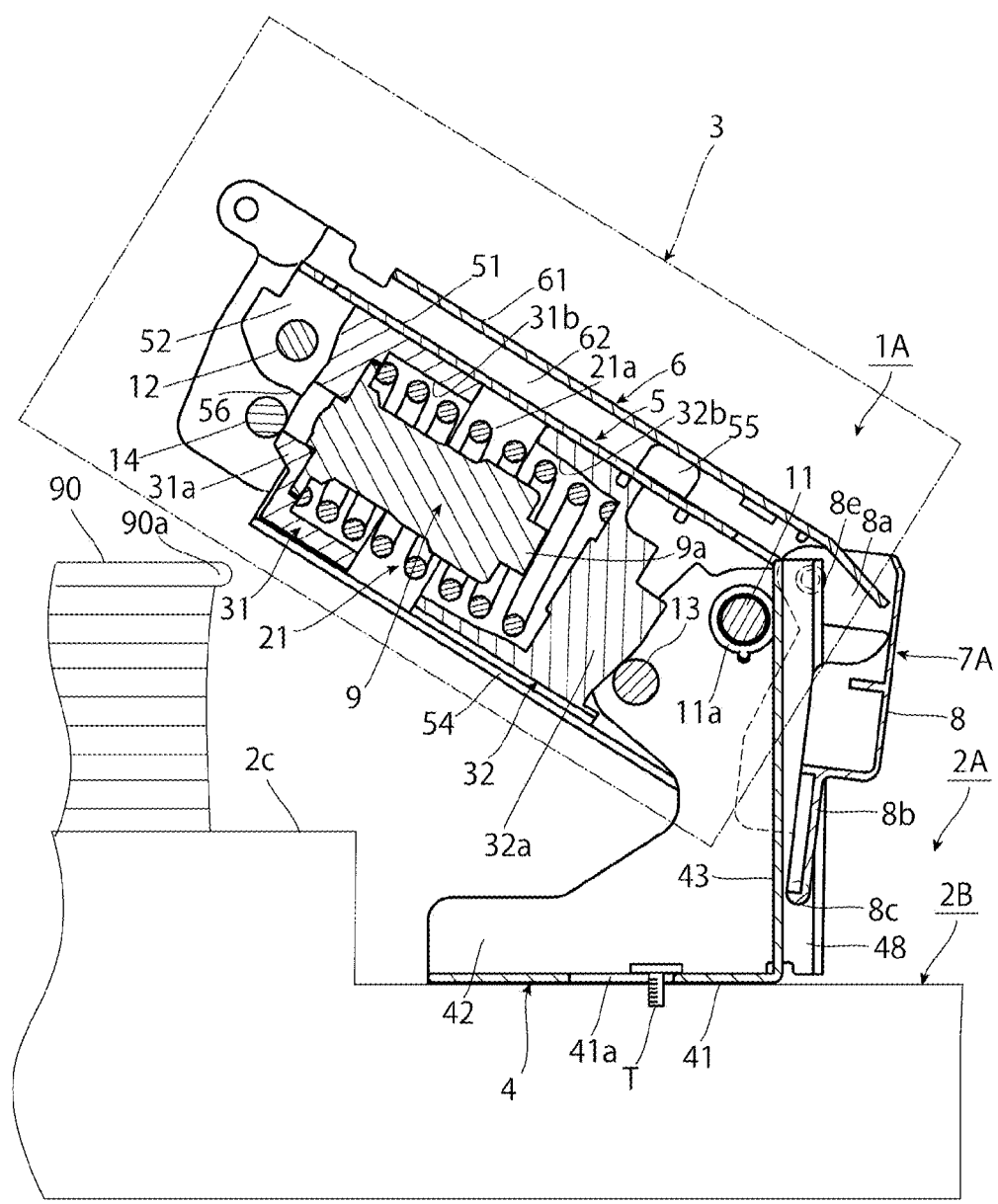
FIG. 9 shows a vertical cross section of a document cover closer according to the invention as opened to an intermediate opening angle.

As shown in FIG. 7, an attaching member 4 is composed of a bottom plate 41 attached to an upper end side on a rear portion of a main body 2B; both side plates 42, 42 extending from both side end portions of the bottom plate 41 in a direction perpendicular (also substantially perpendicular) to the bottom plate 41; and a rear plate 43 extending from one end portion (rear end portion) of the bottom plate 41 in a direction perpendicular (also substantially perpendicular) to the bottom plate 41.

A bottom plate 41 is formed substantially in the rectangular shape, and a large and a small attaching holes 41b, 41b for attaching it to a main body 2B with attaching bolts T, etc. are provided on it. The both side plates 42, 42 are formed substantially in the L shape, and first hinge shaft holes 46, 46 are provided at positions at which the plates extend perpendicular to the bottom plate 41. Pressurized member holes 47, 47 are provided at positions further toward the bottom plate 41 (below) from the first hinge shaft holes 46, 46 on the both side plates 42, 42 and inclined toward an inside (forward). A pressurized member 13 is inserted into the pressurized member holes 47, 47 of the both side plates 42, 42. It is noted that the pressurized member 13 does not need to have a pin-like shape, but may be a curved piece or made of resin which is attached to a space between the both side plates 42, 42.

Still further, rail portions 48, 48 for a finger pinching preventing cover 7A to be described below are formed on an attaching member 4 by extending rearward both side plates 42, 42 along both sides of a rear plate 43 and folding their respective tip portions in parallel with keeping intervals with the rear plate 43.

A supporting member 5 is composed of a top plate 51, both side plates 52, 52 extending from both side end portions along a direction in which a pair of sliders 31, 32 to be described below in a direction perpendicular (also substantially perpendicular) to the top plate 51, and holding pieces 54, 54 formed by folding 90 degrees tip portions of the both side plates 52, 52 respectively toward the opposite side. Still further, stopper pieces 55, 55 are provided upward from the both side plates 52, 52.

Second hinge shaft holes 53, 53 (one only is shown) into which a second hinge shaft 12 is inserted are provided on one end portions (front end portions) of both side plates 52, 52, as well as notch portions 56, 56 (one only is shown) into which an actuating member 14 enters. First hinge shaft insertion holes 58, 58 are provided on other end portions (rear end portions) of the both side plates 52, 52. Respective axes of the first hinge shaft insertion holes 58, 58 of a supporting member 5 and first hinge shaft holes 46, 46 of an attaching member 4 are aligned and then a first hinge shaft 11 is inserted into these holes, so that the supporting member 5 is rotatably coupled to the attaching member 4 about the first hinge shaft 11 being an axis.

A pair of sliders 31, 32 is fitted into a supporting member 5. The pair of sliders 31, 32 respectively comprises closure surfaces 31a, 32a being bottom surfaces, and is formed in the shape of bottomed cylindrical body having a rectangular cross section. The pair of sliders 31, 32 is respectively slidably housed in the supporting member 5 to ensure that their respective openings face each other, and an elastic member 21 consisting of compression coil springs 21a, 21a is resiliently provided in the pair of sliders 31, 32. In other words, concave interiors of the sliders 31, 32 are formed as spring housing portions 31b, 32b for housing the compression coil springs 21a, 21a. One or two or more compression coil spring(s) 21a, 21a may be provided, and for example two of them are arranged in parallel or to overlap each other. They are intended to urge the pair of sliders 31, 32 in a direction in which they are spaced apart. Furthermore, an oil damper 9 is housed in one of the compression coil springs 21a, 21a, and installed between the slider 31 and the slider 32. The oil damper 9 abuts against an inner bottom portion of the slider 31 when a document cover 3 is closed from its opened state to a predetermined closing angle, to prevent a sudden closing and realize a buffering effect.

A pair of sliders 31, 32 is formed in a length to ensure that a document cover 3 is housed in a supporting member 5 when a bottom plate 41 of an attaching member 4 is substantially in parallel to a top plate 51 of a supporting member 5 (when a document cover 3 is in close contact with a surface of a contact glass 2c on an upper surface of a main body 2B for example in case that a document cover closer 1A according to the invention is attached to a copying machine 2A).

An outer surface of a closure surface 31a being a bottom surface of a slider 31 on the tip side is formed into a flat surface. The closure surface 31a presses an actuating member 14 by an urging force of an elastic member 21 to ensure that a supporting member 5 and a lift member 6 overlap each other. In this case, the invention is configured to ensure that a position at which the lift member 6 is coupled to the supporting member 5 using a second hinge shaft 12 is shifted upward as compared to the conventional arrangement, and that a lower surface side of a top plate 61 of a lift member 6 abuts against stopper pieces 55, 55 provided to project upward from both side plates 52, 52 of a supporting member 5; thus it is configured to ensure that a gap comes up between a top plate 51 of the supporting member 5 and the top plate 61 of the lift member 6 to avoid an inclination of the lift member 6 relative to the supporting member 5.

A lift member 6 is composed of a top plate 61 attached to a rear end side on a rear portion of a document cover 3; and both side plates 62, 62 extending from both side end portions of the top plate 61 in a direction perpendicular (also substantially perpendicular) to the top plate 61. Second hinge shaft insertion holes 63, 63 (one only is shown) are provided on tip sides of the both side plates 62, 62 of the lift member 6, and actuating member holes 64, 64 into which an actuating member 14 is inserted are provided below the second hinge shaft insertion holes 63, 63. A pressurized member 14 is inserted into the pressurized member holes 64, 64 of the both side plates 62, 62 and fixed to them. Respective axes of the second hinge shaft insertion holes 63, 63 of the both side plates 62, 62 of the lift member 6 and second hinge shaft insertion holes 53, 53 of a supporting member 5 are aligned and then a second hinge shaft 12 is inserted into the second hinge shaft insertion holes 63, 63 and the second hinge shaft insertion holes 53, 53, so that the lift member 6 is rotatably coupled to the supporting member 5 about the second hinge shaft 12 being an axis. It is noted that the pressurized member 14 shown in the drawings have a pin or shaft-like shape, but the one of different shape or the one projecting integrally with or separately from the tip side of the lift member 6 may be used. The pressurized member 14 also includes these.

Figure 5:
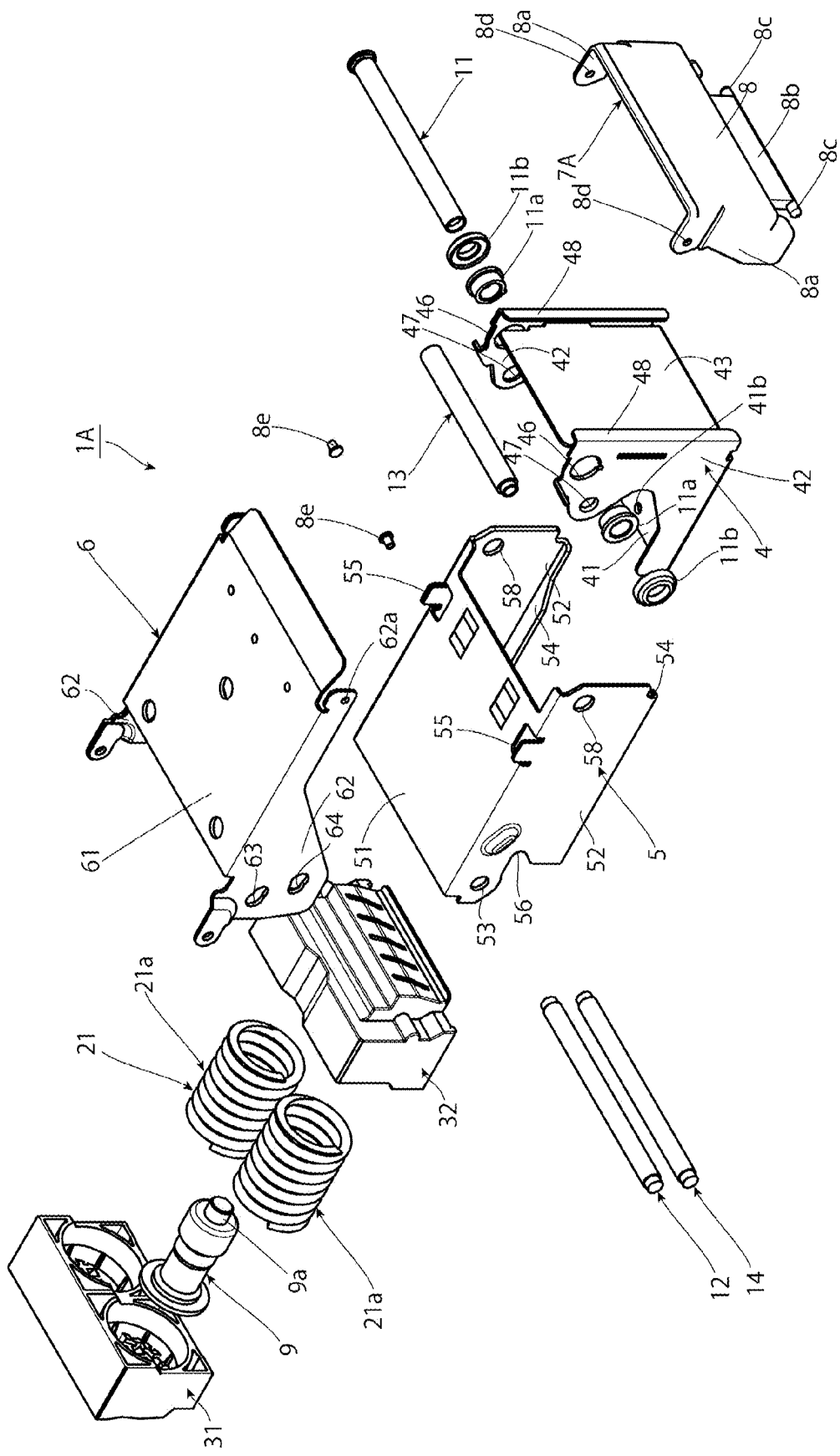
FIG. 5 shows an exploded perspective view of a document cover closer according to the invention.
Figure 6A:
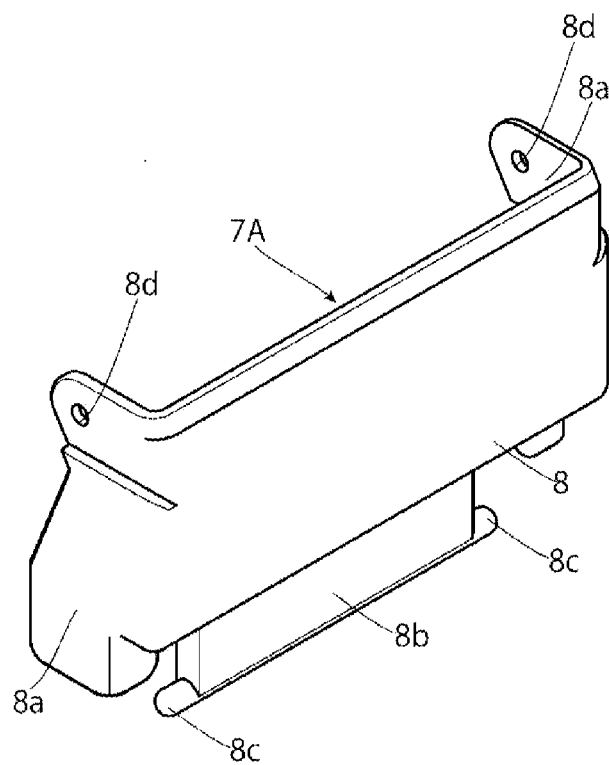
FIGS. 6A and 6B show a finger pinching preventing cover of a document cover closer according to the invention as seen from the rear side, FIG. 6A being a perspective view as seen from the rear side, and FIG. 6B—a perspective view as seen in a turnover state.
Figure 6B:
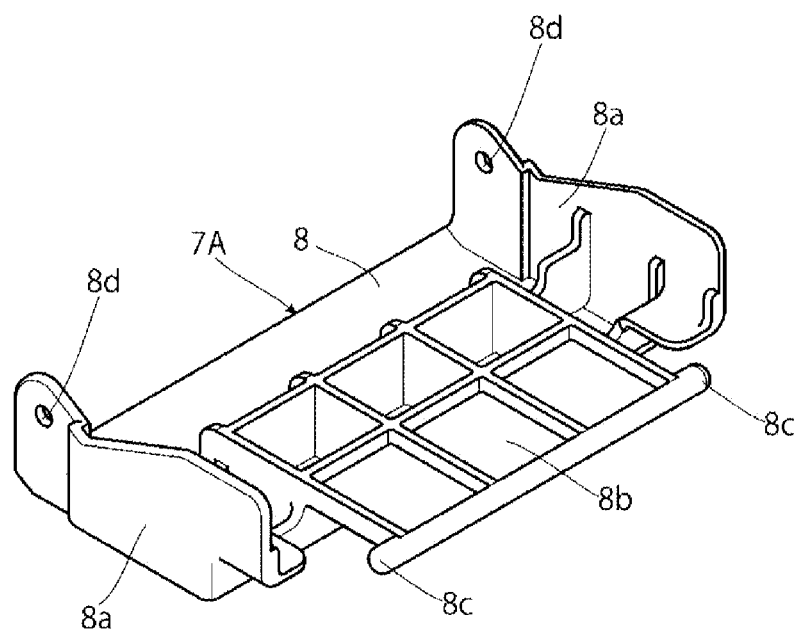

Then, a finger pinching preventing cover 7A is provided between a rear end side of a supporting member 5 and a rear end side of a lift member 6. As shown in FIG. 5 and FIG. 6, the finger pinching preventing cover 7A has a horizontal width equal to that of the lift member 6, and a vertical width to fill a space portion R between the supporting member 5 and the lift member 6, when the lift member 6 is reversed relative to the supporting member 5. The finger pinching preventing cover 7A is composed of a base plate portion 8, both side plates 8a, 8a provided on both sides of the base plate portion 8, and engagement projections 8c, 8c provided to project on both side end portions on a lower end side of an engagement plate portion 8b structured in a narrow width by folding the base plate portion 8 slightly inward. Then, as shown in FIG. 5, attaching holes 62a, 62a (one only is shown) are provided on a right side end portion of both side plates 62, 62 of the lift member 6, and the finger pinching preventing cover 7A is rotatably coupled to the attaching holes 62a, 62a by pivotally supporting pins 8e, 8e passing through attaching holes 8d, 8d provided on upper end portions of the both side plates 8a, 8a of the finger pinching preventing cover 7A. Furthermore, engagement projections 8c, 8c provided on a lower end side of the finger pinching preventing cover 7A are engaged with rail portions 48, 48 provided on an attaching member 4 side.

A document cover closer 1A of this embodiment can stably bring a document into a close contact with an upper surface of a main body 2B of a copying machine 2A, regardless of the thickness of the document. Then, a supporting member 5 is attached to a document cover 3 via a lift member 6 to be described below, so that the document cover closer 1A can prevent as much as possible the external light from entering into the interior of a main body and from blocking an exposure. Moreover, a finger pinching preventing cover 7A can prevent a user from placing his finger(s) into a space portion R between respective rear portions of the supporting member 5 and the lift member 6 to have them pinched.

Still further, a document cover closer 1A of this embodiment ensures that a lower surface of a top plate 61 of a lift member 6 abuts against stopper pieces 55, 55 of a supporting member 5 and that a top plate 51 of the supporting member 5 is substantially in parallel to the top plate 61 of the lift member 6, so that a rear end portion of the lift member 6 is not rotated downward. In this manner, when a document cover 3 is lifted to place a document on a surface of a contact glass 2c on an upper surface of a main body 2B, the document cover 3 is normally lifted upward with holding a grasping portion provided on an end portion opposite to a point at which the lift member 6 of the document cover 3 is attached; thus the document cover 3 is rotated about a first hinge shaft 11 being an axis to expose the surface of the contact glass 2c toward the outside. A document is placed on the surface exposed in this manner of the contact glass 2c.

When a document cover 3 once lifted is lowered after placing a document, the document cover 3 is rotated about a first hinge shaft 11 being an axis in a direction in which the document cover 3 is in contact with the surface of the contact glass 2c (shifted downward). Here, a document cover 3 is rotated, while a top plate 61 of a lift member 6 keeps abutting against stopper pieces 55, 55 of a supporting member 5 by an urging force of an elastic member 21, in other words, the document cover 3 keeps avoiding a rotation of the document cover 3 (a lift member 6) about a second hinge shaft 12 being an axis.

Here, if a document placed on the surface of the contact glass 2c is thin like paper, a document cover 3 is in surface contact when it is in contact with paper. As a result, an entire document is in contact with the document cover 3 and the document is pressed against the surface of the contact glass 2c, so that the document is stably in close contact with the surface of the contact glass 2c.

Figure 10:
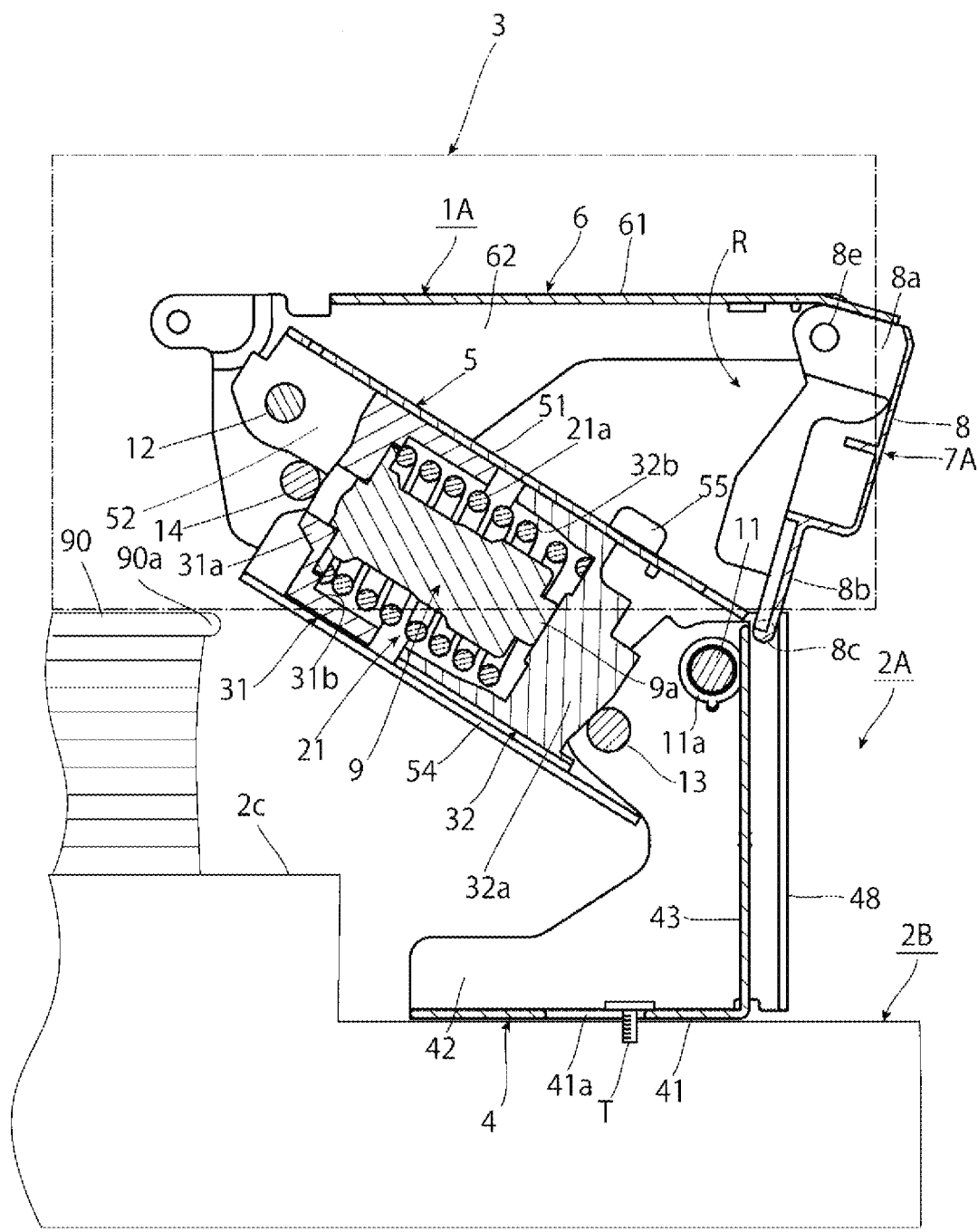
FIG. 10 shows a vertical cross section of a lift member of a document cover closer according to the invention as reversed relative to a supporting member.
Figure 11:
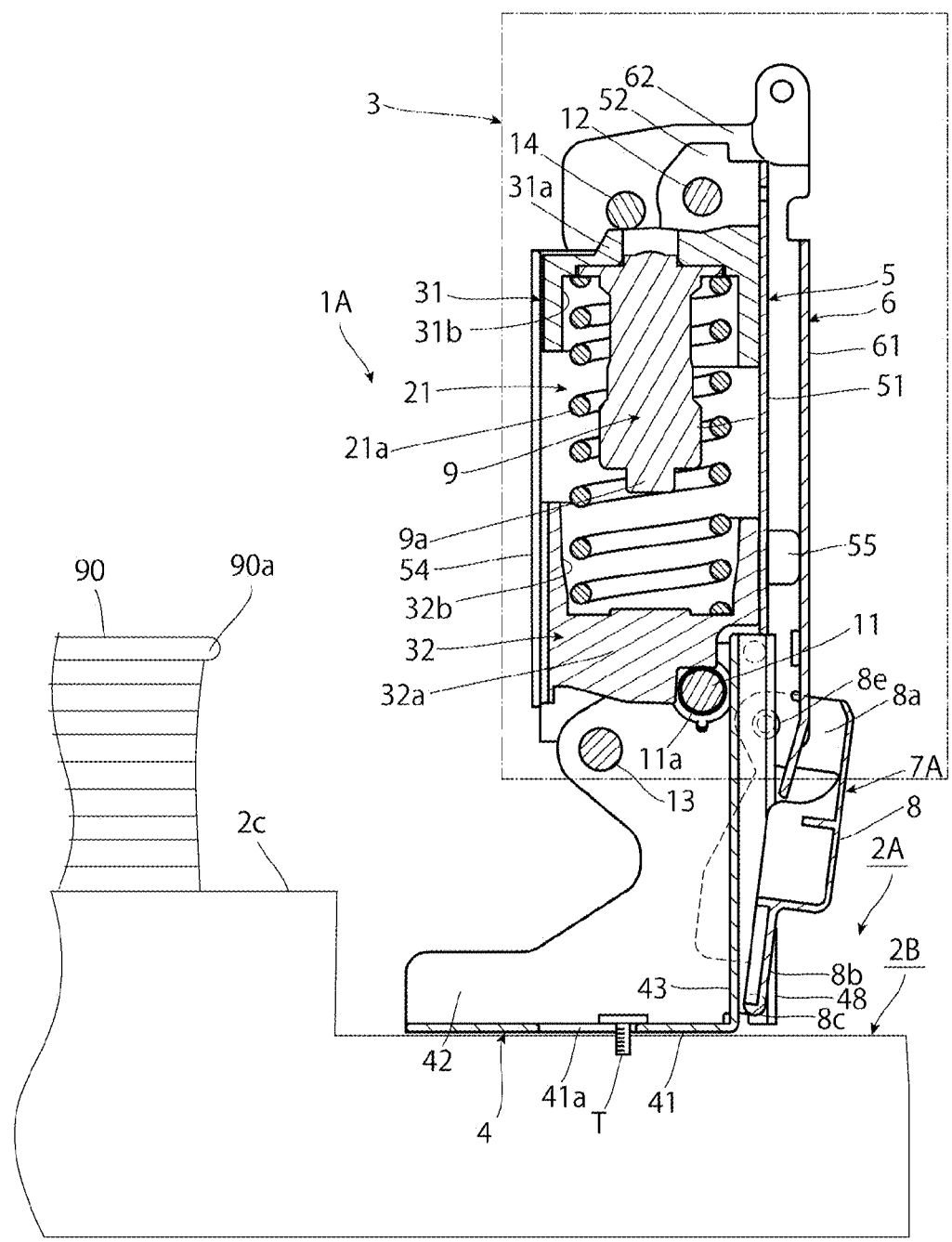
FIG. 11 shows a vertical cross section of a supporting member of a document cover closer according to the invention as opened 90 degrees.

On the other hand, if a document 90 placed on the contact glass 2c is thick like a book as shown in FIG. 10, when a document cover 3 is closed, a part in vicinity of a supporting member 5 of the document cover 3 is in contact with an end portion 90a of the document 90 on a supporting member 5 side or its vicinity, and a space portion is formed between an end portion of the document 90 on a side opposite to that on the supporting member 5 side and the document cover 3. In other words, the document cover 3 is floating on an end portion on a grasping portion side. When a part in vicinity of an end portion on the grasping portion side is pressed against the surface of a contact glass, an actuating member presses a slider 31 to a slider 32 side to ensure that the slider 31 shifts toward the slider 32 side against an urging force of an elastic member 21, and the document cover 3 (the lift member 6) is rotated about the second hinge shaft 12 being an axis. In other words, the document cover 3 shifts to cover an upper portion of the document 90. For example, if the upper portion of the document 90 is a flat surface, the document cover 3 is in surface contact with the upper portion. Accordingly, the document 90 thick like a book is stably in close contact with the surface of the contact glass. Further, when a lift member 6 is rotated about the second hinge shaft 12 being an axis, a space portion R is formed between a rear portion of a lift member and a rear portion of a supporting member. In this case, if the invention is not provided with a finger pinching preventing cover 7A, these is a risk of finger(s) entering into the space portion R; but the space portion R is shielded by the finger pinching preventing cover 7A which can prevent finger(s), etc. from entering into the space portion R and being pinched by it.

Still further, the finger pinching preventing cover 7A according to the invention has its upper end portion side coupled to the lift member 6 by pivotally supporting pins 8e, 8e, and its lower end portion side engaged with rail portions 48, 48 provided on an attaching member 4 by engagement projections 8c, 8c, so that it is configured to make it impossible to artificially remove the finger pinching preventing cover 7A from a copying machine 2A after the finger pinching preventing cover 7A is attached to the copying machine 2A; in this manner, the safety is further enhanced.

INDUSTRIAL APPLICABILITY

As described in detail in the foregoing, a document cover closer 1A can stably assure a close contact of a document with an upper surface of a main body 2B regardless of the thickness of the document, the user can more safely use it than the conventional models with achieving such effect, and it is suitable in use as a document cover closer of office equipment and also as office equipment using a document cover closer.

LIST OF REFERENCE NUMERALS 1A document cover closer
2A copying machine
2B main body
R space portion
3 document cover
4 attaching member
5 supporting member
6 lift member
7A finger pinching preventing cover
8 base plate portion
8a, 8a both side plates
8b engagement plate portion
8c, 8c engagement projection
8e, 8e pivotally supporting pin
85 plate portion
11 first hinge shaft
12 second hinge shaft
13 pressurized member
14 actuating member
21 elastic member
21a compression coil spring
31, 32 slider
48, 48 rail portion

What is claimed is:
1. A document cover closer comprising:
an attaching member attached to a main body side of office equipment having a document cover;
a supporting member rotatably and pivotally supported on said attaching member via a first hinge shaft;
a lift member attached to said document cover, wherein said lift member overlaps said supporting member and is pivotally supported on said supporting member via a second hinge shaft to be rotatable in a direction contrary to said supporting member, and
a finger pinching preventing cover having an upper end portion rotatably coupled to said lift member via pivotally supporting pins and a lower end portion slidably engaged with rail portions provided on said attaching member in order to block up a space portion formed between said lift member and said supporting member, wherein said finger pinching preventing cover has two side plates and is attached at an upper end portion side of both side plates thereof to a rear end portion side of said lift member via the pivotally supporting pins, wherein said finger pinching preventing cover comprises on a lower end portion side thereof engaging projections slidably engaged with said rail portions; and wherein each of said rail portions on said attaching member extends rearward from an associated side plate on said attaching member beyond a rear plate of said attaching member, and wherein each of said rail portions has a tip portion folded inward.

2. Office equipment comprising the document cover closer according to claim 1.

* * * * *

UNITED STATES PATENT AND TRADEMARK OFFICE
CERTIFICATE OF CORRECTION

| | | |
|---|---|---|
| PATENT NO. | : 12,256,509 B2 | Page 1 of 1 |
| APPLICATION NO. | : 17/898643 | |
| DATED | : March 18, 2025 | |
| INVENTOR(S) | : Satoshi Ogawa | |

It is certified that error appears in the above-identified patent and that said Letters Patent is hereby corrected as shown below:

On the Title Page

Add item (30) after item (65) as follows:
(30) Foreign Application Priority Data:
August 31, 2021 (JP)..............................2021-141823

Signed and Sealed this
Twenty-second Day of April, 2025

Coke Morgan Stewart
*Acting Director of the United States Patent and Trademark Office*